US012756532B2

(12) United States Patent
Rao et al.

(10) Patent No.: US 12,756,532 B2
(45) Date of Patent: Oct. 6, 2026

(54) DOUBLE-DATA RATE TRANSMISSION WITHIN A SYSTEM-ON-CHIP VIA NETWORK-ON-CHIP INTERCONNECTS

(71) Applicant: Microsoft Technology Licensing, LLC, Redmond, WA (US)

(72) Inventors: Hari Madhava Rao, Vista, CA (US); Gregory Christopher Burda, Raleigh, NC (US); Anthony Dale Klein, Raleigh, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/924,572

(22) Filed: Oct. 23, 2024

(65) Prior Publication Data

US 2026/0113174 A1 Apr. 23, 2026

(51) Int. Cl.

| | |
|---|---|
| ***G06F 1/10*** | (2006.01) |
| ***H03K 5/06*** | (2006.01) |
| ***H03K 5/14*** | (2014.01) |
| ***H04L 7/00*** | (2006.01) |

(52) U.S. Cl.

CPC .............. *H04L 7/0008* (2013.01); *G06F 1/10* (2013.01); *H03K 5/06* (2013.01); *H03K 5/14* (2013.01)

(58) Field of Classification Search

CPC .... G06F 1/10; H03K 5/06; H03K 5/14; H04L 7/0008

USPC .................. 327/261; 713/400, 401, 503, 600

See application file for complete search history.

(56) References Cited

U.S. PATENT DOCUMENTS

| | | | | |
|---|---|---|---|---|
| 2008/0066040 | A1 | 3/2008 | Taylor | |
| 2025/0028889 | A1* | 1/2025 | Mishra | G06F 30/27 |
| 2025/0348456 | A1* | 11/2025 | Fernandez | G06F 1/12 |
| 2025/0390648 | A1* | 12/2025 | Fernandez | G06F 30/31 |

OTHER PUBLICATIONS

International Search Report and Written Opinion received for PCT Application No. PCT/US2025/037473, Nov. 3, 2025, 10 pages.

* cited by examiner

*Primary Examiner* — William Hernandez

(74) *Attorney, Agent, or Firm* — Michael T. Abramson; Jordan IP Law, LLC

(57) ABSTRACT

Double-data rate (DDR) transmission within a system-on-chip (SoC) via network-on-chip (NOC) interconnects is described. A method for transmitting data includes a local programmable delay circuit receiving a source synchronous clock (SSC) signal and outputting a delayed source synchronous clock (SSC) signal. The method further includes a local pulse generator, associated with a first NOC interconnect stage, receiving the delayed SSC signal and generating a first pulse in response to a first phase of the delayed SSC signal and generating a second pulse in response to a second phase of the delayed SSC signal. The method further includes a flop-repeater circuit, associated with the first NOC interconnect stage, capturing and launching data received from the source circuit in response to each of the first pulse and the second pulse. The method further includes a local offset circuit receiving the delayed SSC signal and providing a de-skewed SSC signal.

20 Claims, 10 Drawing Sheets

100

300

400

500

600

800

900

DOUBLE-DATA RATE TRANSMISSION WITHIN A SYSTEM-ON-CHIP VIA NETWORK-ON-CHIP INTERCONNECTS

BACKGROUND

Systems-on-chip (SoCs) are increasingly becoming larger in size with higher amounts of data being moved from one portion of the SoC to another portion of the SoC. While many SoCs include a network-on-chip (NOC) to help with this movement of data, the increasing length of the NOC pipes within the SoCs coupled with the larger amount of data being moved is impacting both performance of the SoC and the area used by the NOC pipes within the SoC. As an example, many such NOC pipes use single-data rate (SDR) clocking, which includes sending one piece of data per clock cycle. While SDR clocking may be sufficient for smaller SoCs with lower amounts of data movement, better methods and systems for moving data within the SoCs are required for bigger SoCs with larger amounts of data movement.

SUMMARY

In one example, the present disclosure relates to a network-on-chip (NOC) interconnect for transmitting data from a source circuit to a sink circuit, where the NOC interconnect is clocked using a source synchronous clock signal. The NOC interconnect may include a first NOC interconnect stage, configured to receive data from the source circuit. The first NOC interconnect stage may include a local programmable delay circuit to receive the source synchronous clock signal and output a delayed source synchronous clock signal.

The first NOC interconnect stage may further include a local pulse generator configured to receive the delayed source synchronous clock signal and generate a first pulse in response to a first phase of the delayed source synchronous clock signal and generate a second pulse in response to a second phase of the delayed source synchronous clock signal. The first NOC interconnect stage may further include a flop-repeater circuit to both capture and launch data received from the source circuit in response to each of the first pulse and the second pulse. The first NOC interconnect stage may further include a local offset circuit, where the local offset circuit is configured to receive the delayed source synchronous clock signal and provide a de-skewed source synchronous clock signal.

The NOC interconnect may further include a second NOC interconnect stage configured to receive the launched data from the flop-repeater circuit and the de-skewed source synchronous clock signal from the local offset circuit.

In another example, the present disclosure relates to a method for transmitting data from a source circuit to a sink circuit using a network-on-chip (NOC) interconnect, where the NOC interconnect is clocked using a source synchronous clock signal. The method may further include a local programmable delay circuit, associated with a first NOC interconnect stage of the NOC interconnect, receiving the source synchronous clock signal and outputting a delayed source synchronous clock signal.

The method may further include a local pulse generator, associated with the first NOC interconnect stage, receiving the delayed source synchronous clock signal and generating a first pulse in response to a first phase of the delayed source synchronous clock signal and generating a second pulse in response to a second phase of the delayed source synchronous clock signal. The method may further include a flop-repeater circuit, associated with the first NOC interconnect stage, capturing and launching data received from the source circuit in response to each of the first pulse and the second pulse. The method may further include a local offset circuit, associated with the first NOC interconnect stage, receiving the delayed source synchronous clock signal and providing a de-skewed delayed source synchronous clock signal.

In yet another example, the present disclosure relates to a system comprising a first functional block coupled to a source circuit. The system may further include a second functional block coupled to a sink circuit. The system may further include a network-on-chip (NOC) interconnect for transmitting data from the source circuit to the sink circuit, where the NOC interconnect is clocked using a source synchronous clock signal.

The NOC interconnect may include a first NOC interconnect stage, configured to receive data from the source circuit, comprising a local programmable delay circuit to receive the source synchronous clock signal and output a delayed source synchronous clock signal. The NOC interconnect may further include a local pulse generator configured to receive the delayed source synchronous clock signal and generate a first pulse in response to a first phase of the delayed source synchronous clock signal and generate a second pulse in response to a second phase of the delayed source synchronous clock signal.

The NOC interconnect may further include a flop-repeater circuit to both capture and launch data received from the source circuit in response to each of the first pulse and the second pulse. The NOC interconnect may further include a local offset circuit, where the local offset circuit is configured to receive the delayed source synchronous clock signal and provide a de-skewed source synchronous clock signal.

The NOC interconnect may further include a second NOC interconnect stage configured to receive the launched data from the flop-repeater circuit and the de-skewed source synchronous clock signal from the local offset circuit, where data is transmitted across the NOC interconnect during each of two phases of a clock signal for a corresponding NOC interconnect stage, allowing transmission of the data across the NOC interconnect at twice the rate possible with transmission of data during only one of the two phases of the clock signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
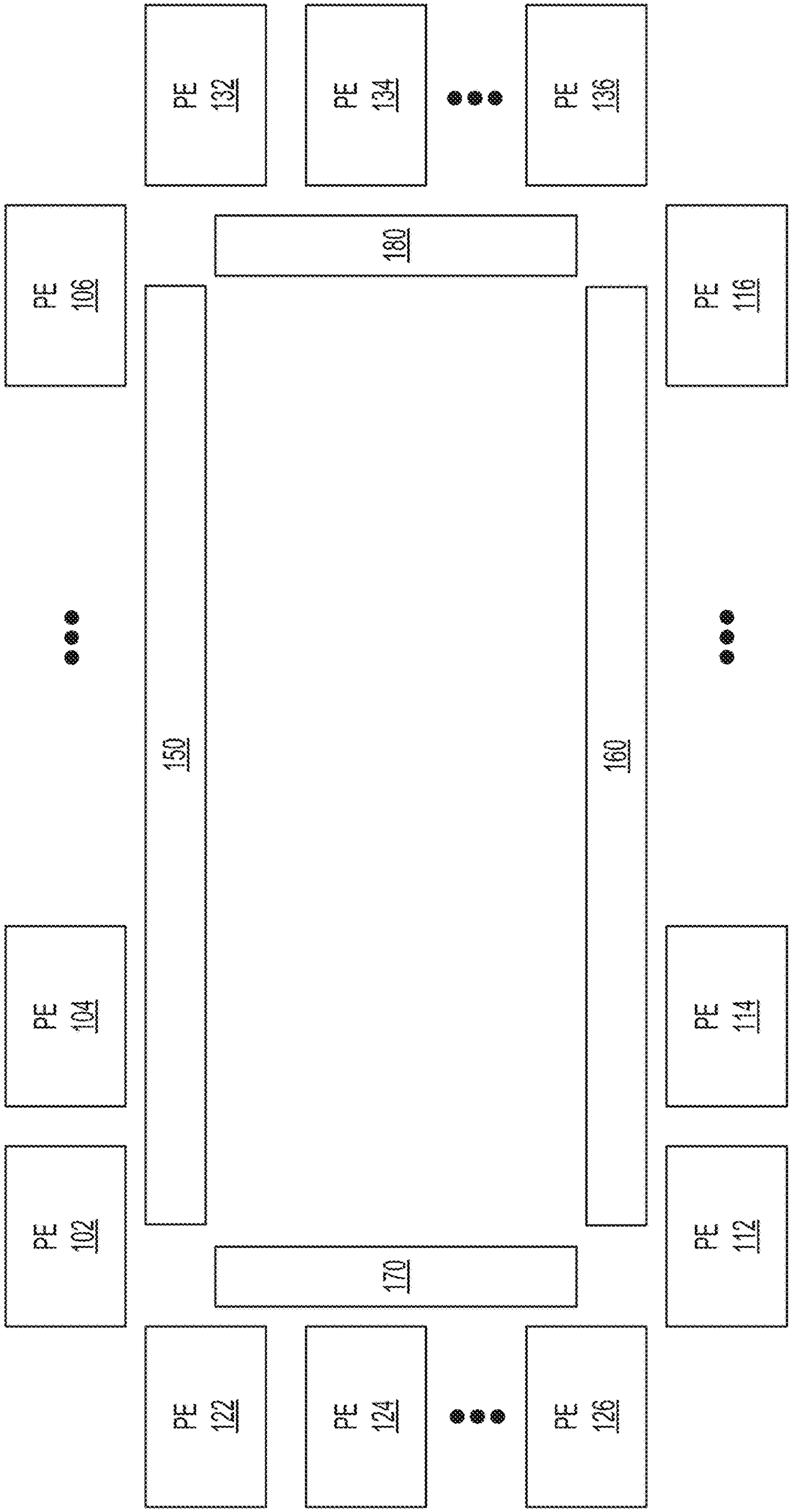
FIG. 1 shows a system-on-chip (SoC) with processing elements coupled with network-on-chip (NOC) interconnects in accordance with one example.

Examples described in this disclosure relate to double-data rate (DDR) transmission within a system-on-chip (SoC) via network-on-chip (NOC) interconnects. As noted earlier, systems-on-chip are increasingly becoming larger in size with higher amounts of data being moved from one portion of the SoC to another portion of the SoC. While many SoCs include a network-on-chip (NOC) to help with this movement of data, the increasing length of the NOC pipes within the SoCs coupled with the larger amount of data being moved is impacting both performance of the SoC and the area used by the NOC pipes within the SoC. As an example, many such NOC pipes use single-data rate (SDR) clocking, which includes sending one piece of data per clock cycle. While SDR clocking may be sufficient for smaller SoCs with lower amounts of data movement, better methods and systems for moving data within the SoCs are required for bigger SoCs with larger amounts of data movement.

Certain examples described herein relate to the use of a double-data rate (DDR) clocking for transfer of data within the SoC, which unlike the SDR clocking, allows transfer of two pieces of data per clock cycle (e.g., one piece of data per phase of the clock). In addition, as part of the SDR scheme, typically an inverted clock is used to sample the data while maximizing setup/hold margins. This SDR scheme, however, comes with a penalty of a deep point-of-divergence (POD) that significantly increases clock uncertainty. The clock uncertainty becomes a more serious issue when higher frequencies are used as part of clocking within the SoC. The DDR scheme described herein does not invert the clock, but instead locally generates the sampling pulses at both edges of the clock to achieve double-data transfer rates.

The DDR clocking can be based on source synchronous clocking where the clock runs at 1X GHz and the data runs at 2X GHz. Advantageously, the use of this scheme allows almost 100 percent bus utilization and an area efficiency that is twice that of the SDR scheme given that the same wire is used to transmit twice the amount of data. However, DDR comes with its own challenges. Synchronizing clock and data for successful transfers is challenging given the high frequency of operation (e.g., at gigahertz frequencies) and the associated timing uncertainties. The examples described herein address these challenges by implementing: (1) a programmable delay for the clock to build setup margin to capture the data, and (2) a de-skew technique to keep the clock and data transmission "in sync" at each flop-repeater along the NOC interconnect. The use of the de-skew technique automatically tracks any process, voltage, temperature (PVT) variations, making the transfer of the data across the interconnect at a double-data rate (DDR) dependable and fast. Advantageously, through this robust on-die DDR scheme, one can cut the number of interconnects in half, saving almost 50% of the area, while at the same time improving the latency of transfer by 50% due to the doubling of the rate of data transfer. Moreover, the solutions described herein scale well with the increasing demands associated with high-frequency transfer of data, while minimizing the area occupied by the NOC interconnects.

FIG. 1 shows a system-on-chip (SoC) 100 with processing elements coupled with network-on-chip (NOC) interconnects in accordance with one example. In this example, to emphasize the most relevant features, SoC 100 is not shown with all of the features that SoC 100 can include. SoC 100 includes several processing elements (PEs) that can be the sender or the recipient of data via the NOC interconnects. As an example, SoC 100 is shown with PE 102, PE 104, and PE 106 on the north side of the SoC. SoC 100 is further shown with PE 112, PE 114, and PE 116 on the south side of the SoC. SoC 100 is further shown with PE 122, PE 124, and PE 126 on the west side of the SoC. Finally, SoC 100 is shown with PE 132, PE 134, and PE 136 on the east side of the SoC. SoC 100 is further shown with NOC interconnects 150, 160, 170, and 180. NOC interconnects 150, 160, 170, and 180 may be implemented as part of the metal layers included within SoC 100. In one example, SoC 100 is a large SoC, such that each of NOC interconnects 150, 160, 170, and 180 is at least a few millimeters long. As a result, the data is moved using these NOC interconnects in multiple clock cycles. The NOC interconnects 150, 160, 170, and 180 are implemented to reduce the area occupied by them and yet to offer double-data rate despite the uncertainties caused by jitters, duty-cycle variations, and process-voltage-temperature (PVT) variations. Although FIG. 1 shows SoC 100 as including a certain number of components arranged in a certain manner, SoC 100 may include additional or fewer components, arranged differently.

Figure 2:
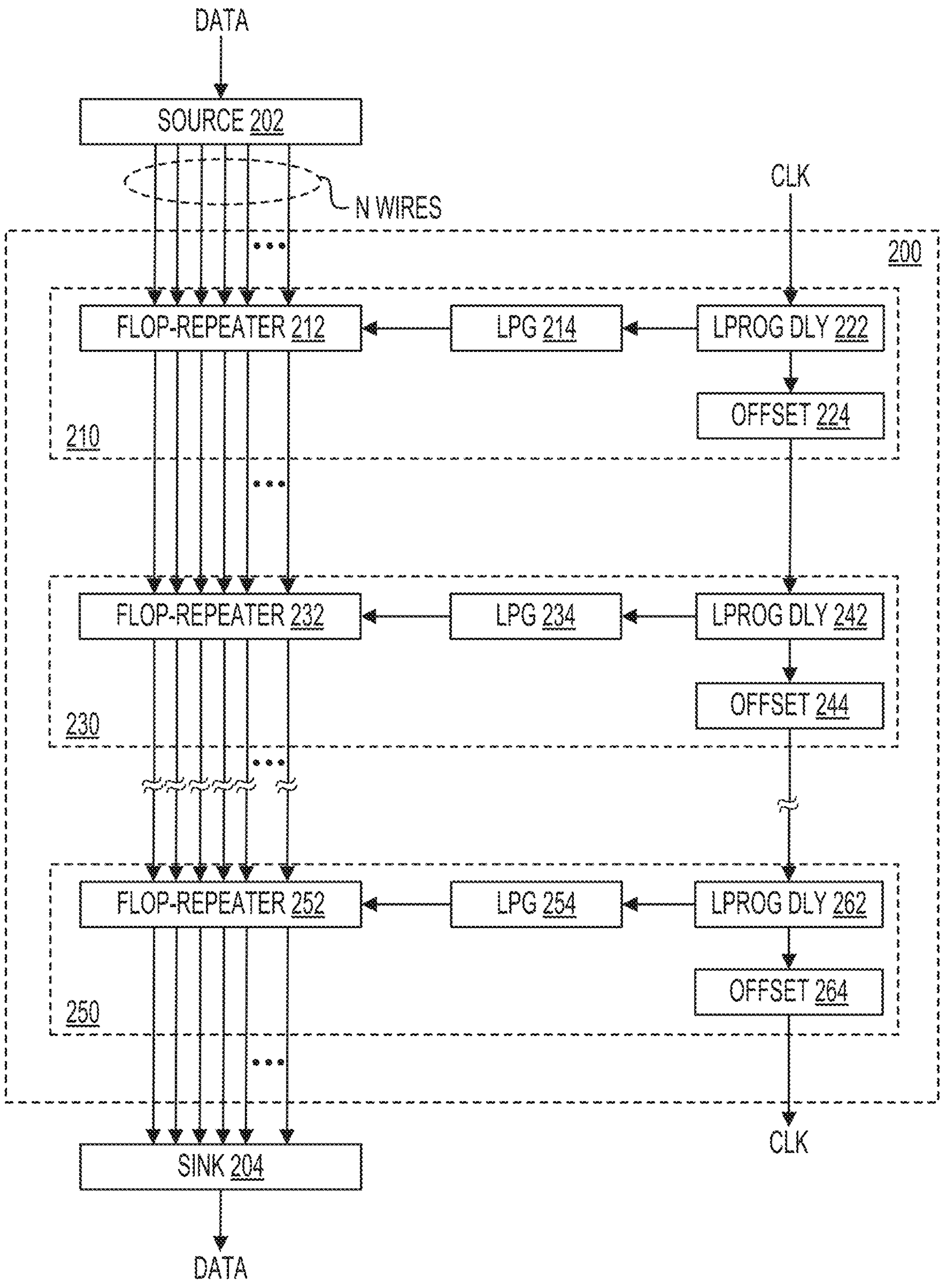
FIG. 2 shows an example NOC interconnect within the SoC of FIG. 1.

FIG. 2 shows an example NOC interconnect 200 within the SoC 100 of FIG. 1. NOC interconnect 200 can be used to implement at least a portion of each of the NOC interconnects 150, 160, 170, and 180 of FIG. 1. In this example, NOC interconnect 200 is shown as receiving data from a source 202 within the SoC 100 and transmitting the data to a sink 204 within the SoC 100. In this example, source 202 can be implemented as a first-in-first-out (FIFO) buffer that is configured to receive data from a component (e.g., any of the processing elements shown in FIG. 1) within the SoC 100. Moreover, sink 204 can be implemented as a first-in-first-out (FIFO) buffer that is configured to receive data from the NOC interconnect 200, which can then be provided to one of the components (e.g., any of the processing elements shown in FIG. 1) within the SoC 100. NOC interconnect 200 is also shown as receiving a clock signal (CLK). In this example, the CLK signal is a source synchronous clock signal that can be used for moving data within at least a portion of the SoC 100 of FIG. 1. In one example, a phase-locked loop (PLL), or a similar clock circuit, can be used to provide the CLK signal to the NOC interconnect 200.

With continued reference to FIG. 2, NOC interconnect 200 comprises several interconnect stages, including interconnect stage 210, interconnect stage 230, and interconnect stage 250. The interconnect stages can be joined together to form the NOC interconnect 200, as shown in FIG. 2. Interconnect stage 210 is configured to capture data received from source 202 and launch that data towards interconnect stage 230. Interconnect stage 230 is configured to capture data received from interconnect stage 210 and launch that data towards interconnect stage 250. Interconnect stage 250 is configured to capture data received from interconnect stage 230 and launch that data towards sink 204. Furthermore, interconnect stage 210 is configured to receive the source synchronous clock signal (CLK), which in turn is provided to interconnect stage 230, and then to interconnect stage 250.

Interconnect stage 210 includes a flop-repeater 212, interconnect stage 230 includes a flop-repeater 232, and interconnect stage 250 includes a flop-repeater 252. Each of the flop-repeaters is implemented to capture the incoming data and then launch the captured data. In this example, each of the flop-repeaters can be implemented using an edge-triggered D-type flip-flop and a buffer. Each interconnect stage further includes a local pulse generator, a local programmable delay circuit, and an offset circuit. In this example, interconnect stage 210 includes a local pulse generator (LPG 214), a local programmable delay circuit (LPROG DLY 222) and an offset circuit (OFFSET 224). Interconnect stage 230 includes a local pulse generator (LPG 234), a local programmable delay circuit (LPROG DLY 242) and an offset circuit (OFFSET 244). Interconnect stage 250 includes a local pulse generator (LPG 254), a local programmable delay circuit (LPROG DLY 262) and an offset circuit (OFFSET 264). Each of the local pulse generators is configured to generate a pulse for each phase of the clock signal (e.g., CLK). As an example, one pulse can be associated with the high phase of the clock signal and the other pulse can be associated with the low phase of the clock signal.

At each interconnect stage, the received clock signal is subjected to a programable delay using the local programmable delay circuit. The amount of the programmable delay is configurable via fuses or other such elements included within the SoC. In one example, the amount of the programmable delay is at least equal to an amount that allows the clock signal to have enough set up margin to be able to capture the data as part of a respective flop-repeater. The offset circuits are configured to keep the data and the clock signal "in sync" at each flop-repeater stage. This allows each flop-repeater stage to ensure that the clock signal and the data signals are in sync before being launched to be captured by the next flop-repeater stage or for capture by the sink (e.g., sink 204 of FIG. 2). Although FIG. 2 shows NOC interconnect 200 as including a certain number of components arranged in a certain manner, NOC interconnect 200 may include additional or fewer components, arranged differently.

Figure 3:
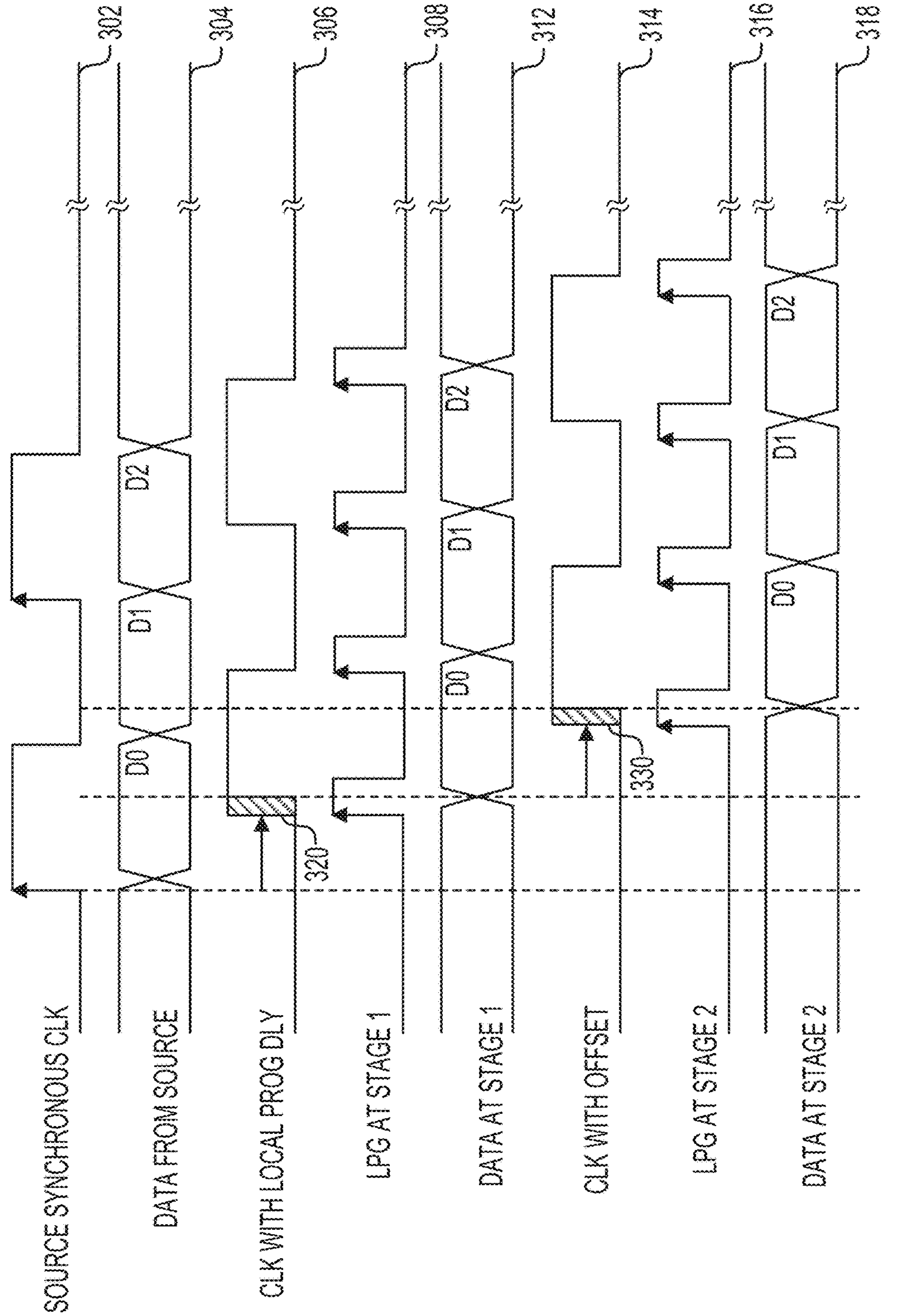
FIG. 3 shows example waveforms associated with the clock and data signals associated with the NOC interconnect of FIG. 2.

FIG. 3 shows example waveforms 300 associated with the clock and data signals associated with the NOC interconnect 200 of FIG. 2. Waveform 302 corresponds to the source synchronous clock. In this example, the source synchronous clock corresponds to the CLK signal in FIG. 2. As an example, the source synchronous clock may have a frequency of 2.4 GHz. Waveform 304 corresponds to the data signals for reception by an interconnect stage (e.g., interconnect stage 210 of FIG. 2). In this example, the data from the source (implemented as a FIFO) can be read at twice the frequency at which it can be written to the FIFO. Waveform 306 corresponds to the clock signal (e.g., CLK signal of FIG. 2) with an added local programmable delay. In this example, a local programmable delay circuit (e.g., LPROG DLY 222 of FIG. 2) included within an interconnect stage (e.g., interconnect stage 210 of FIG. 2) can generate the delay. As noted above, the amount of the programmable delay (e.g., 320 in FIG. 3) is configurable. In one example, the amount of the programmable delay is at least equal to an amount that allows the clock signal to have enough set up margin to be able to capture the data as part of a respective flop-repeater. This includes any timing uncertainties associated with the generation and the propagation of the source synchronous clock signal.

With continued reference to FIG. 3, waveform 308 corresponds to the local pulses generated by a local pulse generator (e.g., LPG 214 of FIG. 2). In this example, a pulse is generated for each phase of the clock signal (e.g., the source synchronous CLK signal (also, referred to as the CLK signal in FIG. 2). As an example, one pulse can be associated with the high phase of the clock signal and the other pulse can be associated with the low phase of the clock signal. Waveform 308 corresponds to the local pulse generator (e.g., LPG 214 of FIG. 2) associated with the first stage downstream from the source of the NOC interconnect 200. Waveform 312 corresponds to data at a flop-repeater associated with the first stage downstream from the source of the NOC interconnect. As an example, waveform 312 corresponds to data that is launched from flop-repeater 212, which is associated with interconnect stage 210 of NOC interconnect 200 of FIG. 2. Waveform 314 corresponds to the clock signal output from an offset circuit associated with the first stage downstream from the source of the NOC interconnect. As an example, waveform 314 corresponds to the clock signal output by offset 224, which is associated with interconnect stage 210 of NOC interconnect 200 of FIG. 2. As explained earlier, the offset circuits are configured to keep the data and the clock signal "in sync" at each flop-repeater stage by de-skewing the clock signal by a certain amount (e.g., an amount of 330 shown in FIG. 3). In one example, the amount of offset equals the amount of delay associated with the flops (e.g., primary and secondary within the flop-repeater) and any other circuits associated with the flop-repeater. This delay can be viewed as the delay in the clock signal from the time it reaches an input terminal of a flop-repeater to the time the clock signal reaches an output terminal of the flop-repeater. The offsetting of the clock signal allows each flop-repeater stage to ensure that the clock signal and the data signals are in sync before being launched to be captured by the next flop-repeater stage or for capture by the sink (e.g., sink 204 of FIG. 2).

Still referring to FIG. 3, waveform 316 corresponds to the local pulses generated by a local pulse generator (e.g., LPG 234 of FIG. 2). In this example, a pulse is generated for each phase of the clock signal (e.g., the source synchronous CLK signal (also referred to as the CLK signal in FIG. 2). As noted earlier, one pulse can be associated with the high phase of the clock signal and the other pulse can be associated with the low phase of the clock signal. Waveform 316 corresponds to the local pulse generator (e.g., LPG 234 of FIG. 2) associated with a stage 2 (the second stage downstream from the source) of the NOC interconnect 200. Waveform 318 corresponds to data at a flop-repeater associated with a stage 2 (the second stage downstream from the source) of the NOC interconnect. As an example, waveform 318 corresponds to data that is captured by flop-repeater 232, which is associated with interconnect stage 230 of NOC interconnect 200 of FIG. 2. As shown via the waveforms 300 in FIG. 3 by de-skewing the clock signals at each interconnect stage, the data signals and the clocks signals are kept in alignment.

Figure 4:
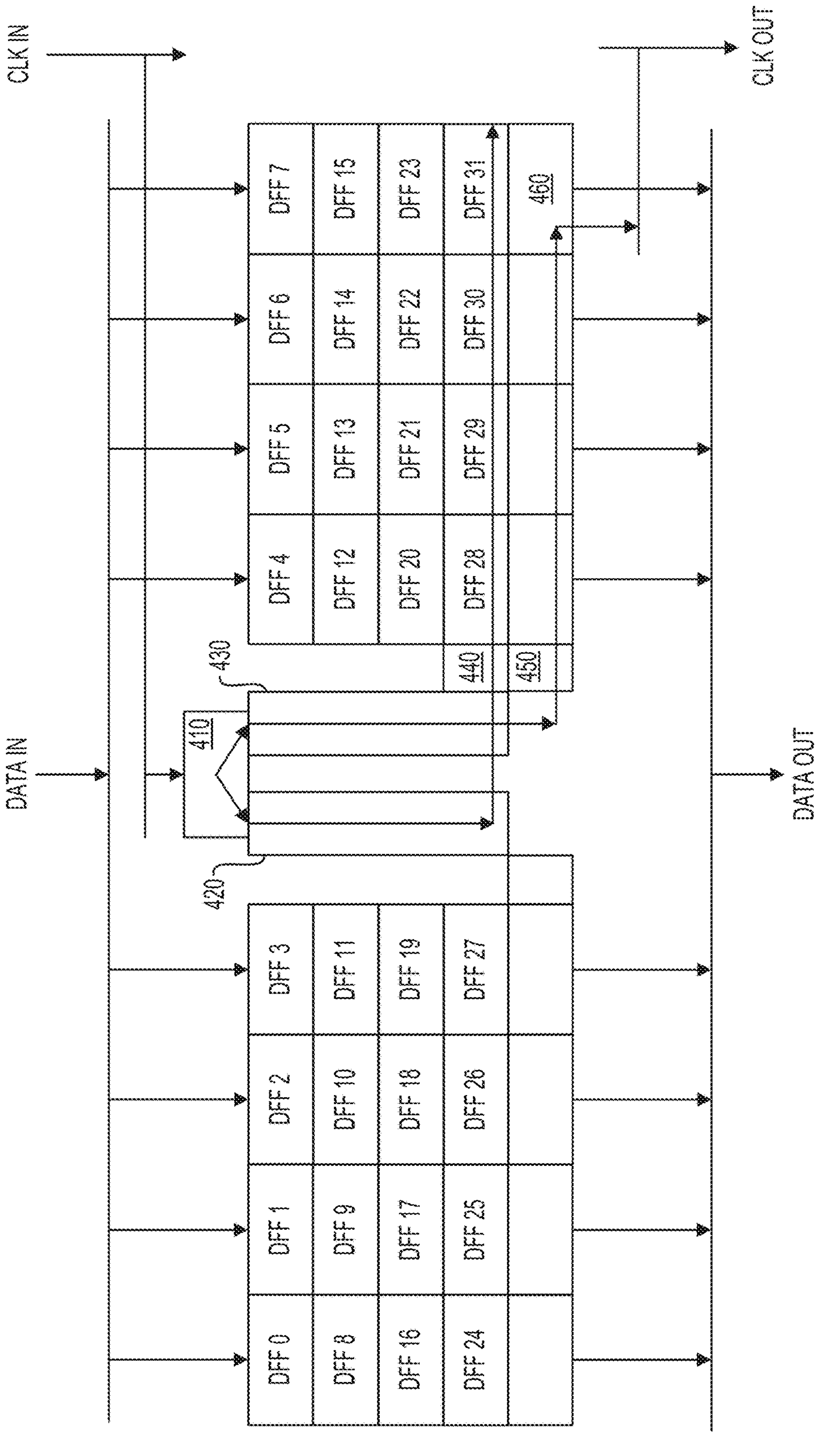
FIG. 4 shows an example flop-repeater stage for use with a 32-bit NOC interconnect.

FIG. 4 shows an example flop-repeater stage 400 for use with a 32-bit NOC interconnect. Flop-repeater stage 400 includes 32 D-type flip-flops (DFFs), labeled as DFF 0, DFF 1, . . . . DFF 31. Like interconnect stage 210 of NOC interconnect 200 of FIG. 2, flop-repeater stage 400 is implemented to capture the incoming data (received via DATA IN) and then launch the captured data (launched via DATA OUT). Flop-repeater stage 400 includes a local programmable delay circuit 410, a local pulse generator 420, and an offset circuit 430. Each of the local pulse generators is configured to generate a pulse for each phase of the clock signal (e.g., CLK). As an example, one pulse can be associated with the high phase of the clock signal and the other pulse can be associated with the low phase of the clock signal. Each row of the D-type flip-flops further includes a re-driver (acting as a buffer). As an example, re-driver 440 is shown in FIG. 4 for the row including DFF 28, DFF 29, DFF 30, and DFF 31. In addition, flop-repeater stage 400 includes a re-driver 450 for the de-skewed clock signal. Moreover, flop-repeater stage 400 includes a dummy path 460 for the clock signal, which mimics the delay associated with the pulses generated by the local pulse generator for a respective row of D-type flip-flops.

The offset circuit 430 and the dummy path 460 are configured to keep the data and the clock signal "in sync" at each flop-repeater stage. This allows each flop-repeater stage to ensure that the clock signal and the data signals are in sync before being launched to be captured by the next flop-repeater stage or for capture by the sink. Although FIG. 4 shows flop-repeater stage 400 as including a certain number of components arranged in a certain manner, flop-repeater stage 400 may include additional or fewer components, arranged differently. As an example, flop-repeater stage 400 may be configured to have fewer or more D-type flip-flops.

Figure 5:
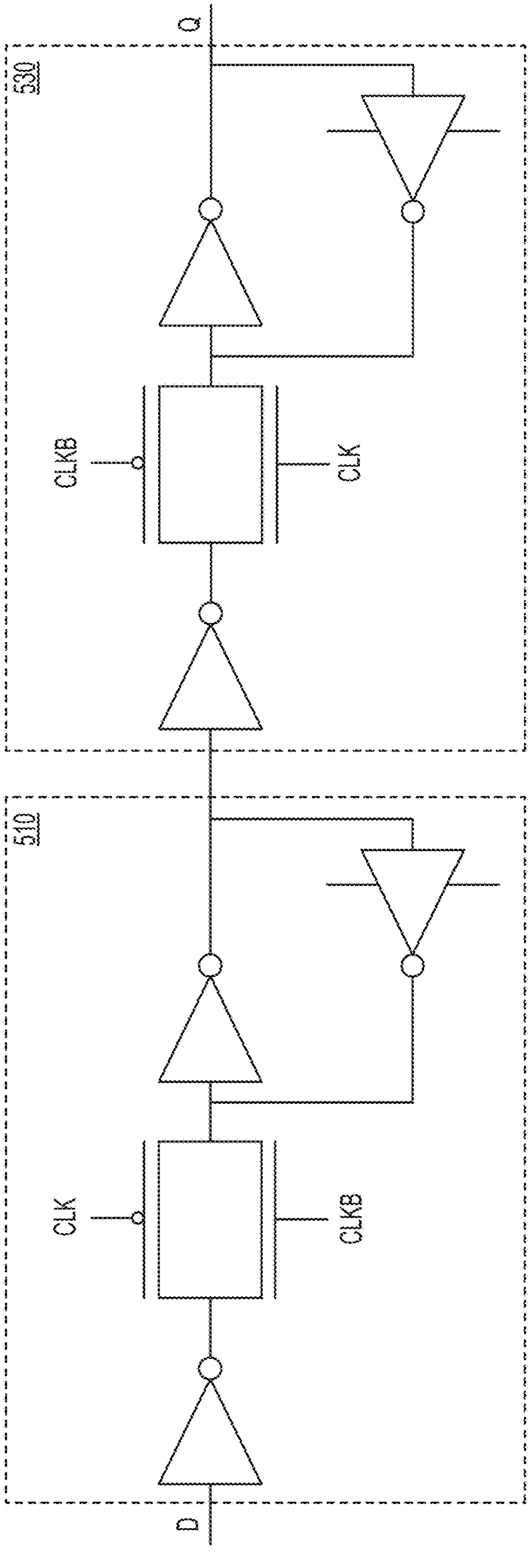
FIG. 5 shows a diagram of a rising-edge triggered D-type flip-flop (DFF) for use as part of the flop-repeaters in accordance with one example.

FIG. 5 shows a diagram of a rising-edge triggered D-type flip-flop (DFF) 500 for use as part of the flop-repeaters in accordance with one example. Rising-edge triggered DFF 500 includes a first stage 510 and a second stage 530. Data is received by the first stage 510 via the input terminal (D) and is latched when a rising edge of a locally generated pulse, described earlier, is received by the first stage. At the same time, the previously captured data as part of the second stage 530 can be provided via the output terminal (Q). Although FIG. 5 shows a specific type of flip-flop for use with the flop-repeaters described herein, other types of flip-flops or circuits can also be used. As an example, instead of the D-type flip-flop (DFF 500) shown in FIG. 5, a pulse latch could be used as part of the flop-repeaters.

Figure 6:
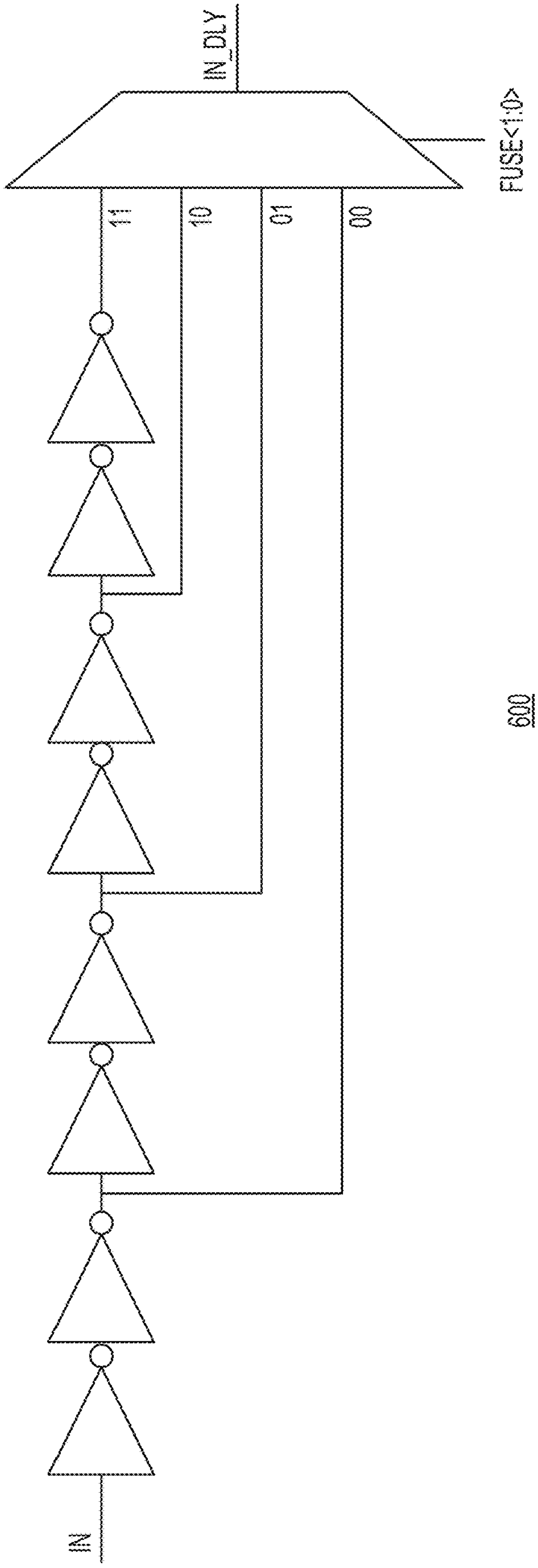
FIG. 6 shows a diagram of a local programmable delay circuit for use as part of the flop-repeaters in accordance with one example.

FIG. 6 shows a diagram of a local programmable delay circuit 600 for use as part of the flop-repeaters in accordance with one example. As an example, local programmable delay circuit 600 can be used to implement any of LPROG DLY 222, LPROG DLY 242, and LPROG DLY 262 described earlier with respect to FIG. 2. In this example, the local programmable delay circuit 600 includes a series of inverters coupled between an input terminal (IN) and a multiplexer, which is coupled to the output terminal (IN_DLY). The multiplexer is coupled to receive four inputs: one with a delay generated by two inverters, one with a delay generated by four inverters, one with a delay generated by six inverters, and one with a delay generated by eight inverters. Depending on the control signal provided via fuse bits (FUSE<1:0>), or via other circuitry, the input signal received by the local programmable delay circuit 600 is delayed by an amount indicated by the control signal. Thus, if the control signal is 00, then the input signal is delayed by an amount of delay introduced by two inverters. If the control signal is 01, then the input signal is delayed by an amount of delay introduced by four inverters. If the control signal is 10, then the input signal is delayed by an amount of delay introduced by six inverters. If the control signal is 11, then the input signal is delayed by an amount of delay introduced by eight inverters. In this manner, the amount of delay is programmable. As noted earlier, the amount of the programmable delay is at least equal to an amount that allows the clock signal to have enough set up margin to be able to capture the data as part of a respective flop-repeater. This includes any timing uncertainties associated with the generation and the propagation of the source synchronous clock signal.

Figure 7:
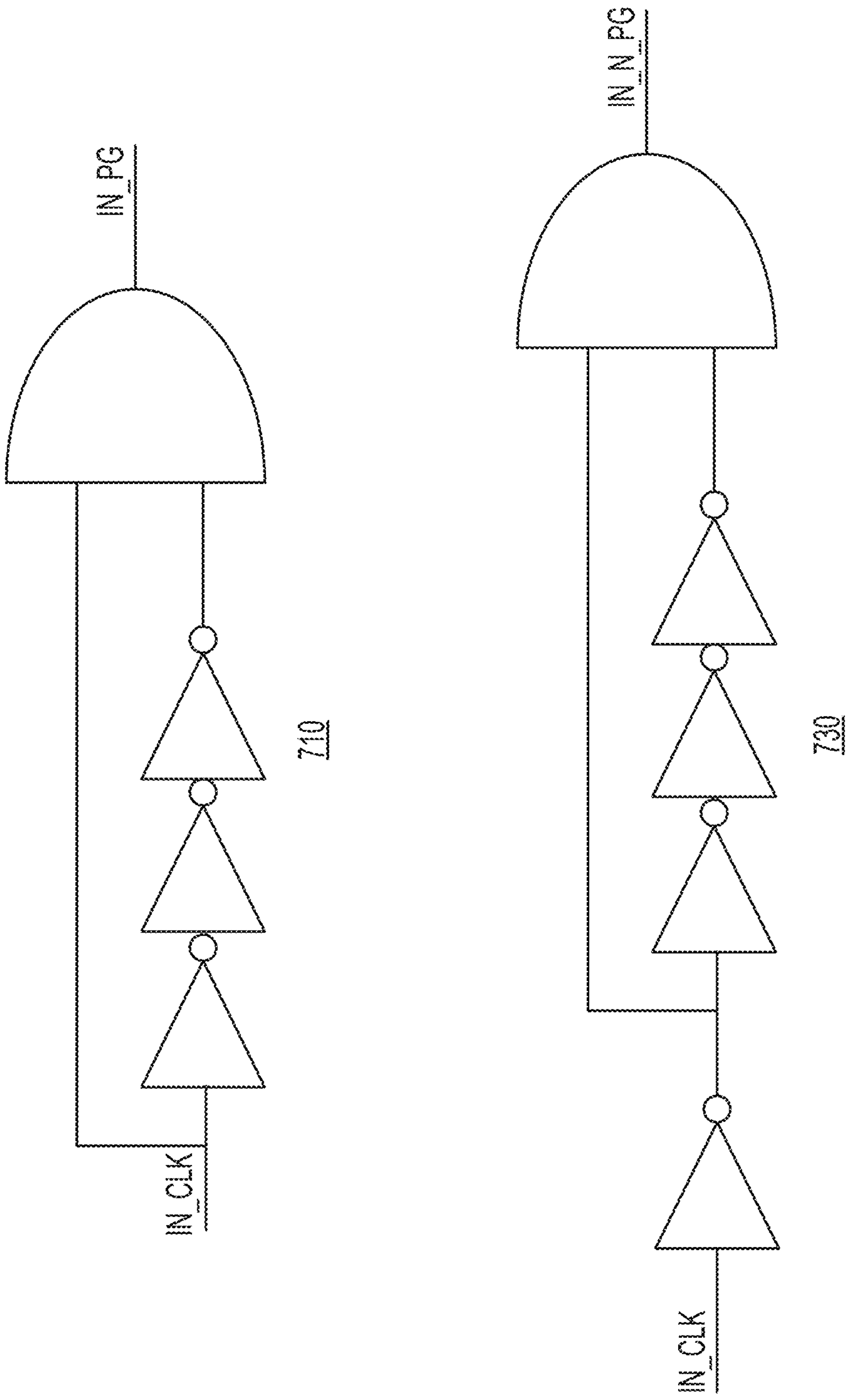
FIG. 7 shows diagrams of a positive edge triggered pulse generator (PG) and a negative edge triggered pulse generator (PG) for use as part of the flop-repeaters.

FIG. 7 shows diagrams of a positive edge triggered pulse generator (PG) 710 and a negative edge triggered pulse generator (PG) 730 for use as part of the flop-repeaters. The positive edge triggered pulse PG 710 receives an input clock signal (e.g., the source synchronous clock signal described earlier) and generates a positive edge triggered pulse, whose pulse width can be controlled using an appropriate chain length for the inverters shown in FIG. 7. Similarly, the negative edge triggered pulse PG 730 receives an input clock signal (e.g., the source synchronous clock signal described earlier) and generates a negative edge triggered pulse, whose pulse width can be controlled using an appropriate chain length of the inverters shown in FIG. 7.

Figure 8:
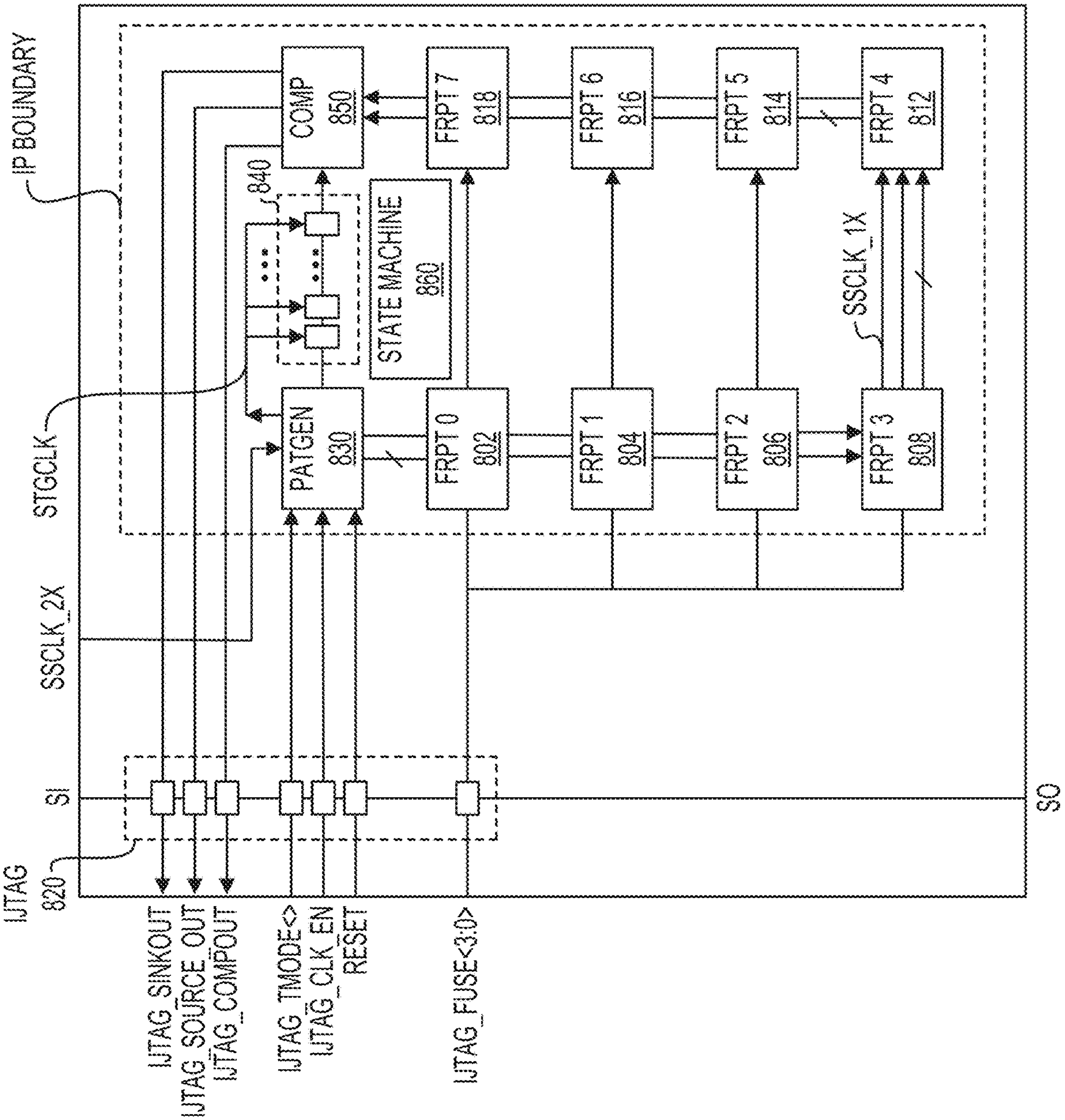
FIG. 8 shows a loop-back test setup for an example NOC interconnect within an SoC.

FIG. 8 shows a loop-back test setup for an example NOC interconnect within an SoC 800. In this example, an internal joint test action group (IJTAG)-based setup is being shown. SI input can be used to scan data in and SO output can be used to scan data out. SoC 800 shows an NOC interconnect that connects eight flop-repeaters (e.g., FRPT 0 802, FRPT 1 804, FRPT 2 806, FRPT 3 808, FRPT 4 812, FRPT 5 814, FRPT 6 816, and FRPT 7 818) in a loop-back fashion. Thus, data that originates at point A (e.g., data captured and launched by a flop-repeater (e.g., FRPT 0 802) is compared with data that reaches point B (e.g., data captured and launched by another flop-repeater (e.g., FRPT 7 818)). This way data that is directed from north to south is redirected back to north and then compared with the data that was originally transmitted to test the NOC interconnect and associated components. In this example, a pattern generator block (e.g., PATGEN 830) is used to generate various scan patterns to test the NOC interconnect. The output scan pattern data is provided to a flop repeater (e.g., FRPT 0 802) and at the same time to staging flops 840. The data received from the staging flops 840 and the data captured and launched by another flop repeater (e.g., FRPT 7 818) is compared using a comparator (e.g., COMP 850). The terminal labeled as IJTAG_SINKOUT can be used to obtain the data received by the comparator, the terminal labeled as IJTAG_SOURCEOUT can be used to obtain the data provided by the pattern generator, and the terminal IJTAG_COMPOUT can be used to receive the result of the comparison between the two data sets.

State machine logic (e.g., state machine 860) can be used to provide control signals for various stages of the testing. IP Boundary shown in FIG. 8 includes the NOC interconnect that is being tested. IJTAG 820 includes components to interface with control signals associated with the IJTAG test set up. Additional details regarding the various signals and clocks associated with the test set up of FIG. 8 are described with respect to FIG. 9. Although FIG. 8 shows the loop-back test setup for the example NOC interconnect within the SoC 800 as having certain components that are arranged in certain manner, other loop-back test setups with different components and a different arrangement may also be used.

Figure 9:
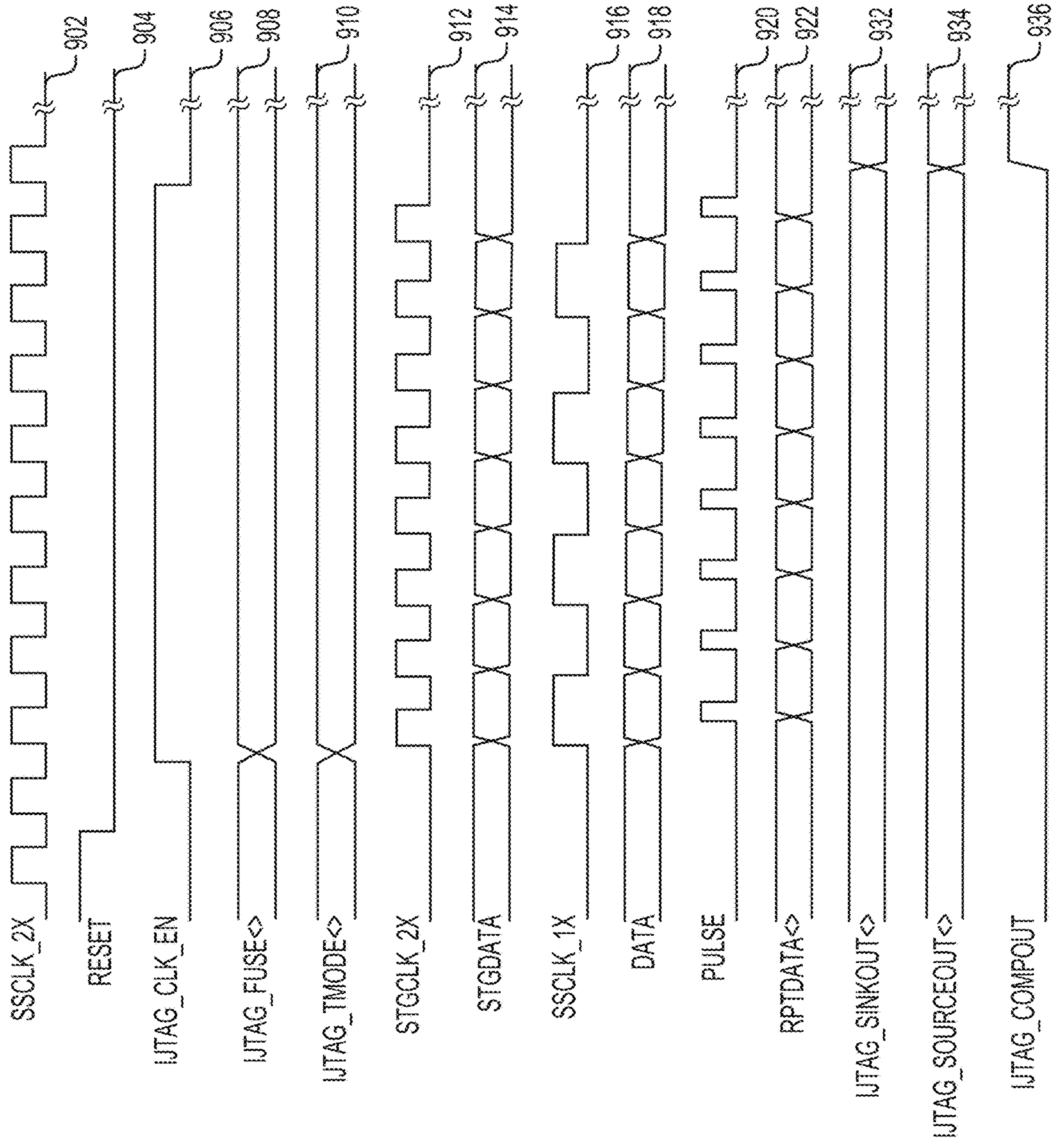
FIG. 9 shows example waveforms associated with the loop-back test setup of FIG. 8.

FIG. 9 shows example waveforms 900 associated with the loop-back test setup of FIG. 8. Waveform 902 corresponds to the source synchronous clock (SSCLK_2X). The 2X nomenclature for the clock signal is used to distinguish another clock signal that is used as part of the test setup, which runs at a frequency (X) that is half of the frequency (2X) of the source synchronous clock. Waveform 904 corresponds to the reset signal (RESET), which can be received from a controller to allow for the resetting of certain aspects of the test set up. Waveform 906 corresponds to an enable signal (IJTAG_CLK_EN) that can be used to enable the clock for the IJTAG. Waveform 908 corresponds to fuse signals (IJTAG_FUSE<0:3>), which are configuration signals that can be received from a fuse setup within the SoC. Waveform 910 corresponds to a test mode signal (IJTAG_T-MODE). Waveform 912 corresponds to a staging clock signal (STGCLK_2X), which is used to clock the staging flops 840 of FIG. 8. Waveform 914 corresponds to data being output from staging flops 840 of FIG. 8 to the comparator (COMP 850 of FIG. 8).

With continued reference to FIG. 9, waveform 916 corresponds to a clock signal (SSCLK_1X) that can be provided by the pattern generator (e.g., PATGEN 830 of FIG. 8) to a flop repeater (e.g., FRPT 0 802). Waveform 918 corresponds to data being provided by the pattern generator (e.g., PATGEN 830 of FIG. 8) to a flop repeater (e.g., FRPT 0 802 of FIG. 8) and at the same time to staging flops 840. As shown in FIG. 8, the flop-repeater (FRPT 0 802) is the first flop-repeater that is part of the NOC interconnect including seven other flop-repeaters. The data being generated by the pattern generator is looped back through the remaining flop-repeaters to the comparator (e.g., COMP 850 of FIG. 8). As described earlier, a local pulse generator is configured to generate a pulse for each phase of the clock signal (e.g., SSCLK_1X). As an example, one pulse can be associated with the high phase of the clock signal and the other pulse can be associated with the low phase of the clock signal. Waveform 920 shows an example set of pulses being generated locally at the flop-repeater to capture the data being received and to launch the data towards the next flop-repeater. Waveform 922 shows the data being captured and launched by the next flop-repeater (e.g., FRPT 1 804 of FIG. 8). Although not shown in FIG. 9, data is moved from one flop-repeater to the next flop-repeater until it can be compared (e.g., using a comparator) with the data provided by the staging flops (e.g., staging flops 840 of FIG. 8). The staging flops can be configured to provide the same amount of delay as would be encountered by the data as it moves along the eight flop-repeaters (e.g., FRPT 0 802, FRPT 1 804, FRPT 2 806, FRPT 3 808, FRPT 4 812, FRPT 5 814, FRPT 6 816, and FRPT 7 818).

Still referring to FIG. 9, waveform 932 corresponds to the signal obtained from the comparator via the terminal labeled as IJTAG_SINKOUT in FIG. 8. The comparator signal can be analyzed to determine whether any adjustments need to be made to the design of the NOC interconnect, including the flop-repeaters. Waveform 934 corresponds to the signal obtained from the comparator (e.g., COMP 850 of FIG. 8) the via the terminal labeled as IJTAG_SOURCEOUT in FIG. 8. Waveform 936 corresponds to the result of the comparison between the two data sets, which can be obtained via the terminal labeled as IJTAG_COMPOUT in FIG. 8. These waveforms can be further analyzed for design and testing purposes.

Figure 10:
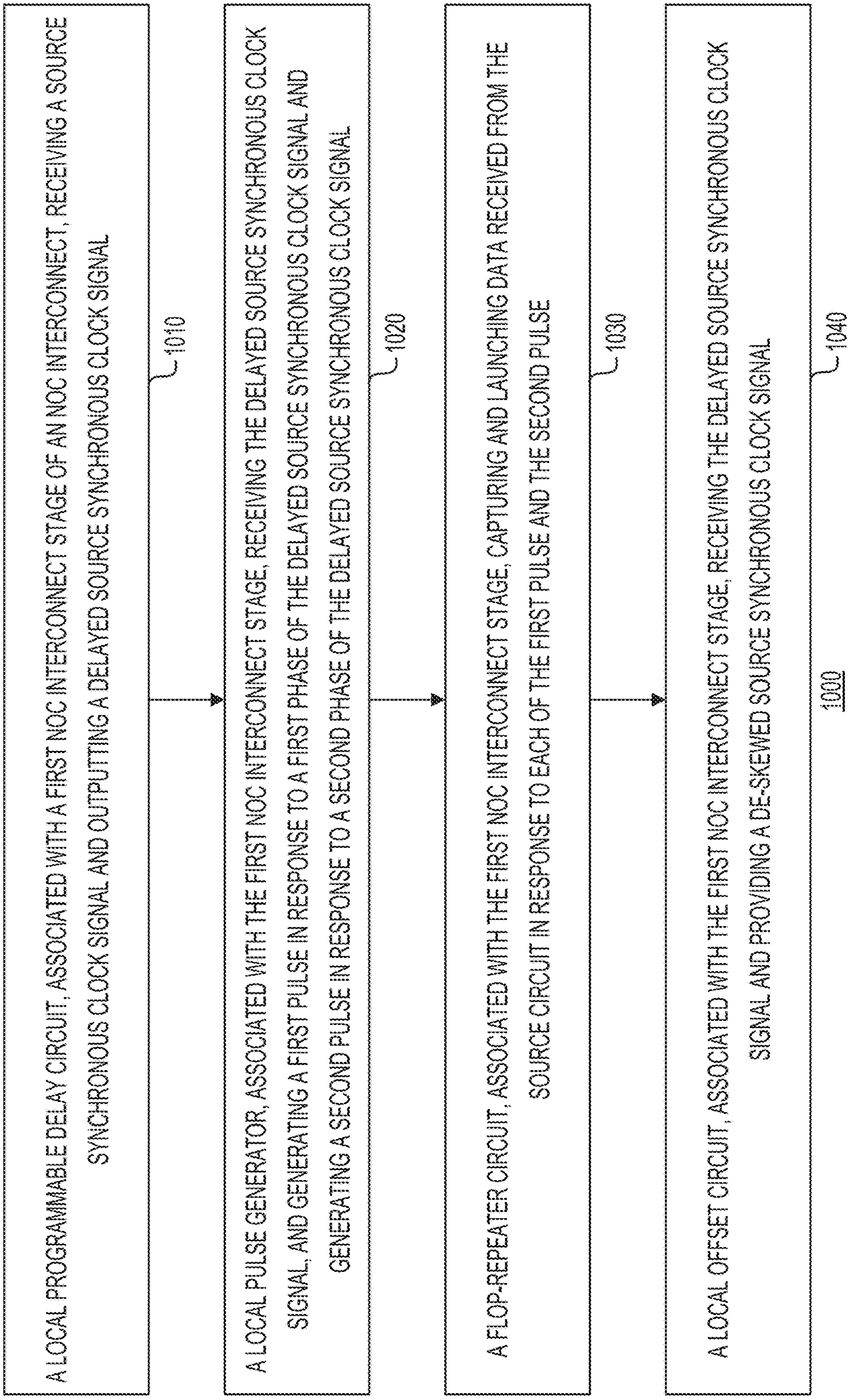
FIG. 10 shows a flow chart of an example method for transmitting data from a source circuit to a sink circuit using a network-on-chip (NOC) interconnect, where the NOC interconnect is clocked using a source synchronous clock signal.

FIG. 10 shows a flow chart 1000 of an example method for transmitting data from a source circuit to a sink circuit using a network-on-chip (NOC) interconnect, where the NOC interconnect is clocked using a source synchronous clock signal. In one example, the steps described with respect to flow chart 1000 may be performed as part of transmitting data across the NOC interconnect 200 described earlier with respect to FIG. 2-9. Step 1010 includes a local programmable delay circuit, associated with a first NOC interconnect stage of the NOC interconnect, receiving the source synchronous clock signal and outputting a delayed source synchronous clock signal. As explained earlier, in one example, the source synchronous clock signal corresponds to the clock signal (e.g., CLK signal of FIG. 2 (also shown as waveform 306 of FIG. 3)). As an example, a local programmable delay circuit (e.g., LPROG DLY 222 of FIG. 2) included within an interconnect stage (e.g., interconnect stage 210 of FIG. 2) can generate the delay and output the delayed source synchronous clock signal. As noted above, the amount of the programmable delay (e.g., 320 in FIG. 3) is configurable. In one example, the amount of the programmable delay is at least equal to an amount that allows the clock signal to have enough set up margin to be able to capture the data as part of a respective flop-repeater. This includes any timing uncertainties associated with the generation and the propagation of the source synchronous clock signal.

Step 1020 includes a local pulse generator, associated with the first NOC interconnect stage, receiving the delayed source synchronous clock signal, and generating a first pulse in response to a first phase of the delayed source synchronous clock signal and generating a second pulse in response to a second phase of the delayed source synchronous clock signal. As an example, waveform 308 corresponds to the local pulses generated by a local pulse generator (e.g., LPG 214 of FIG. 2). In this example, a pulse is generated for each phase of the delayed source synchronous clock signal (e.g., the delayed CLK signal in FIG. 2). As an example, one pulse can be associated with the high phase of the clock signal and the other pulse can be associated with the low phase of the clock signal. Thus, the pulses can correspond to the local pulse generator (e.g., LPG 214 of FIG. 2) associated with the first interconnect stage downstream from the source of the NOC interconnect 200.

Step 1030 includes a flop-repeater circuit, associated with the first NOC interconnect stage, capturing and launching data received from the source circuit in response to each of the first pulse and the second pulse. As an example, waveform 312 of FIG. 3 corresponds to data at a flop-repeater associated with the first stage downstream from the source of the NOC interconnect. As an example, waveform 312 also corresponds to data that is launched from flop-repeater 212 of FIG. 2, which is associated with interconnect stage 210 of NOC interconnect 200 of FIG. 2. The transmitting of data across the NOC interconnect during each of two phases of a clock signal for a corresponding NOC interconnect stage allows transmission of data across the NOC interconnect at twice the rate possible with transmission of data during only one of the two phases of the clock signal.

Step 1040 includes a local offset circuit, associated with the first NOC interconnect stage, receiving the delayed source synchronous clock signal and providing a de-skewed source synchronous clock signal. As an example, waveform 314 of FIG. 3 corresponds to the clock signal output from an offset circuit associated with the first stage downstream from the source of the NOC interconnect. The offset circuit can be offset 224 of FIG. 2, which is associated with interconnect stage 210 of NOC interconnect 200 of FIG. 2. As explained earlier, the offset circuits are configured to keep the data and the clock signal "in sync" at each flop-repeater stage by de-skewing the clock signal by a certain amount (e.g., an amount of 330 shown in FIG. 3). In one example, the amount of offset equals the amount of delay associated with the flops (e.g., primary and secondary within the flop-repeater) and any other circuits associated with the flop-repeater. This delay can be viewed as the delay in the clock signal from the time it reaches an input terminal of a flop-repeater to the time the clock signal reaches an output terminal of the flop-repeater. The offsetting of the clock signal allows each flop-repeater stage to ensure that the clock signal and the data signals are in sync before being launched to be captured by the next flop-repeater stage or for capture by the sink circuit (e.g., sink 204 of FIG. 2).

In conclusion, in one example, the present disclosure relates to a network-on-chip (NOC) interconnect for transmitting data from a source circuit to a sink circuit, where the NOC interconnect is clocked using a source synchronous clock signal. The NOC interconnect may include a first NOC interconnect stage, configured to receive data from the source circuit. The first NOC interconnect stage may include a local programmable delay circuit to receive the source synchronous clock signal and output a delayed source synchronous clock signal.

The first NOC interconnect stage may further include a local pulse generator configured to receive the delayed source synchronous clock signal and generate a first pulse in response to a first phase of the delayed source synchronous clock signal and generate a second pulse in response to a second phase of the delayed source synchronous clock signal. The first NOC interconnect stage may further include a flop-repeater circuit to both capture and launch data received from the source circuit in response to each of the first pulse and the second pulse. The first NOC interconnect stage may further include a local offset circuit, where the local offset circuit is configured to receive the delayed source synchronous clock signal and provide a de-skewed source synchronous clock signal.

The NOC interconnect may further include a second NOC interconnect stage configured to receive the launched data from the flop-repeater circuit and the de-skewed source synchronous clock signal from the local offset circuit.

The second NOC interconnect stage may comprise: (1) a second local programmable delay circuit to receive the de-skewed source synchronous clock signal and output a delayed and de-skewed source synchronous clock signal, (2) a second local pulse generator to receive the delayed and de-skewed source synchronous clock signal and generate a third pulse in response to the first phase of the delayed and de-skewed source synchronous clock signal and generate a fourth pulse in response to the second phase of the delayed and de-skewed source synchronous clock signal, (3) a second flop-repeater circuit to both capture and launch the launched data received from the first NOC interconnect stage in response to each of the third pulse and the fourth pulse, and (4) a second local offset circuit, where the second local offset circuit is configured to receive the delayed and de-skewed source synchronous clock signal and further de-skew the delayed and de-skewed source synchronous clock signal. The NOC interconnect may further comprise a third NOC interconnect stage, where the third NOC interconnect stage is configured to receive the launched data from the second flop-repeater circuit and the further de-skewed delayed and de-skewed source synchronous clock signal from the second local offset circuit.

The data may be transmitted across the NOC interconnect during each of two phases of a clock signal for a corresponding NOC interconnect stage, allowing transmission of the data across the NOC interconnect at twice the rate possible with transmission of data during only one of the two phases of the clock signal. The delayed source synchronous clock signal may be delayed by at least an amount equal to a setup margin associated with the flop-repeater circuit and any timing uncertainties associated with data or clock signals.

The source circuit may comprise a first-in-first-out (FIFO) buffer. The sink circuit may comprise a second FIFO buffer, where data is written into the FIFO buffer associated with the source circuit at a first rate, and where the data is read from the FIFO buffer associated with the source circuit at a second rate, where the second rate is twice the first rate. The data may be written into the second FIFO buffer associated with the sink circuit at the second rate. The data may be read from the second FIFO buffer associated with the sink circuit at the first rate.

In another example, the present disclosure relates to a method for transmitting data from a source circuit to a sink circuit using a network-on-chip (NOC) interconnect, where the NOC interconnect is clocked using a source synchronous clock signal. The method may further include a local programmable delay circuit, associated with a first NOC interconnect stage of the NOC interconnect, receiving the source synchronous clock signal and outputting a delayed source synchronous clock signal.

The method may further include a local pulse generator, associated with the first NOC interconnect stage, receiving the delayed source synchronous clock signal and generating a first pulse in response to a first phase of the delayed source synchronous clock signal and generating a second pulse in response to a second phase of the delayed source synchronous clock signal. The method may further include a flop-repeater circuit, associated with the first NOC interconnect stage, capturing and launching data received from the source circuit in response to each of the first pulse and the second pulse. The method may further include a local offset circuit, associated with the first NOC interconnect stage, receiving the delayed source synchronous clock signal and providing a de-skewed delayed source synchronous clock signal.

The method may further comprise a second NOC interconnect stage receiving the launched data from the flop-repeater circuit and the de-skewed source synchronous clock signal from the local offset circuit. The second NOC interconnect stage may comprise: (1) a second local programmable delay circuit to receive the de-skewed source synchronous clock signal and output a delayed and de-skewed source synchronous clock signal, (2) a second local pulse generator configured to receive the delayed and de-skewed source synchronous clock signal and generate a third pulse in response to the first phase of the delayed and de-skewed source synchronous clock signal and generate a fourth pulse in response to the second phase of the delayed and de-skewed source synchronous clock signal, (3) a second flop-repeater circuit to both capture and launch the launched data received from the first NOC interconnect stage in response to each of the third pulse and the fourth pulse, and (4) a second local offset circuit, where the second local offset circuit is configured to receive the delayed and de-skewed source synchronous clock signal and further de-skew the delayed and de-skewed source synchronous clock signal.

The method may further comprise transmitting data across the NOC interconnect during each of two phases of a clock signal for a corresponding NOC interconnect stage, allowing transmission of the data across the NOC interconnect at twice the rate possible with transmission of data during only one of the two phases of the clock signal. The delayed source synchronous clock signal may be delayed by at least an amount equal to a setup margin associated with the flop-repeater circuit and any timing uncertainties associated with data or clock signals.

The source circuit may comprise a first-in-first-out (FIFO) buffer. The sink circuit may comprise a second FIFO buffer, where data is written into the FIFO buffer associated with the source circuit at a first rate. The data may be read from the FIFO buffer associated with the source circuit at a second rate, where the second rate is twice the first rate. The data may be written into the second FIFO buffer associated with the sink circuit at the second rate. The data may be read from the second FIFO buffer associated with the sink circuit at the first rate.

In yet another example, the present disclosure relates to a system comprising a first functional block coupled to a source circuit. The system may further include a second functional block coupled to a sink circuit. The system may further include a network-on-chip (NOC) interconnect for transmitting data from the source circuit to the sink circuit, where the NOC interconnect is clocked using a source synchronous clock signal.

The NOC interconnect may include a first NOC interconnect stage, configured to receive data from the source circuit, comprising a local programmable delay circuit to receive the source synchronous clock signal and output a delayed source synchronous clock signal. The NOC interconnect may further include a local pulse generator configured to receive the delayed source synchronous clock signal and generate a first pulse in response to a first phase of the delayed source synchronous clock signal and generate a second pulse in response to a second phase of the delayed source synchronous clock signal.

The NOC interconnect may further include a flop-repeater circuit to both capture and launch data received from the source circuit in response to each of the first pulse and the second pulse. The NOC interconnect may further include a local offset circuit, where the local offset circuit is configured to receive the delayed source synchronous clock signal and provide a de-skewed source synchronous clock signal.

The NOC interconnect may further include a second NOC interconnect stage configured to receive the launched data from the flop-repeater circuit and the de-skewed source synchronous clock signal from the local offset circuit, where data is transmitted across the NOC interconnect during each of two phases of a clock signal for a corresponding NOC interconnect stage, allowing transmission of the data across the NOC interconnect at twice the rate possible with transmission of data during only one of the two phases of the clock signal.

The second NOC interconnect stage may comprise: (1) a second local programmable delay circuit to receive the de-skewed source synchronous clock signal and output a delayed and de-skewed source synchronous clock signal, (2) a second local pulse generator configured to receive the delayed and de-skewed source synchronous clock signal and generate a third pulse in response to the first phase of the delayed and de-skewed source synchronous clock signal and generate a fourth pulse in response to the second phase of the delayed and de-skewed source synchronous clock signal, (3) a second flop-repeater circuit to both capture and launch the launched data received from the first NOC interconnect stage in response to each of the third pulse and the fourth pulse, and (4) a second local offset circuit, where the second local offset circuit is configured to receive the delayed and de-skewed source synchronous clock signal and further de-skew the delayed and de-skewed source synchronous clock signal.

The system may further comprise a third NOC interconnect stage, where the third NOC interconnect stage is configured to receive the launched data from the second flop-repeater circuit and the further de-skewed delayed and de-skewed source synchronous clock signal from the second local offset circuit. The delayed source synchronous clock signal may be delayed by at least an amount equal to a setup margin associated with the flop-repeater circuit and any timing uncertainties associated with data or clock signals.

The source circuit may comprise a first-in-first-out (FIFO) buffer. The sink circuit may comprise a second FIFO buffer, where data may be written into the FIFO buffer associated with the source circuit at a first rate. The data may be read from the FIFO buffer associated with the source circuit at a second rate, where the second rate is twice the first rate. The data may be written into the second FIFO buffer associated with the sink circuit at the second rate. The data may be read from the second FIFO buffer associated with the sink circuit at the first rate.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), and Complex Programmable Logic Devices (CPLDs). In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a system, or any other implementation of a functionality, is described herein as being coupled to another component does not mean that the components are necessarily separate components. As an example, a component A described as being coupled to another component B may be a sub-component of the component B, or the component B may be a sub-component of the component A.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A network-on-chip (NOC) interconnect for transmitting data from a source circuit to a sink circuit, wherein the NOC interconnect is clocked using a source synchronous clock signal, the NOC interconnect comprising:

a first NOC interconnect stage, to receive data from the source circuit, comprising: (1) a local programmable delay circuit to receive the source synchronous clock signal and output a delayed source synchronous clock signal, (2) a local pulse generator configured to receive the delayed source synchronous clock signal and generate a first pulse in response to a first phase of the delayed source synchronous clock signal and generate a second pulse in response to a second phase of the delayed source synchronous clock signal, (3) a flop-repeater circuit to both capture and launch data received from the source circuit in response to each of the first pulse and the second pulse, and (4) a local offset circuit, wherein the local offset circuit is configured to receive the delayed source synchronous clock signal and provide a de-skewed source synchronous clock signal; and a second NOC interconnect stage to receive the launched data from the flop-repeater circuit and the de-skewed source synchronous clock signal from the local offset circuit.

2. The NOC interconnect of claim 1, wherein the second NOC interconnect stage comprises: (1) a second local programmable delay circuit to receive the de-skewed source synchronous clock signal and output a delayed and de-skewed source synchronous clock signal, (2) a second local pulse generator to receive the delayed and de-skewed source synchronous clock signal and generate a third pulse in response to the first phase of the delayed and de-skewed source synchronous clock signal and generate a fourth pulse in response to the second phase of the delayed and de-skewed source synchronous clock signal, (3) a second flop-repeater circuit to both capture and launch the launched data received from the first NOC interconnect stage in response to each of the third pulse and the fourth pulse, and (4) a second local offset circuit, wherein the second local offset circuit is configured to receive the delayed and de-skewed source synchronous clock signal and further de-skew the delayed and de-skewed source synchronous clock signal.

3. The NOC interconnect of claim 2, further comprising a third NOC interconnect stage, wherein the third NOC interconnect stage is configured to receive the launched data from the second flop-repeater circuit and the further de-skewed delayed and de-skewed source synchronous clock signal from the second local offset circuit.

4. The NOC interconnect of claim 1, wherein data is transmitted across the NOC interconnect during each of two phases of a clock signal for a corresponding NOC interconnect stage, allowing transmission of the data across the NOC interconnect at twice the rate possible with transmission of data during only one of the two phases of the clock signal.

5. The NOC interconnect of claim 1, wherein the delayed source synchronous clock signal is delayed by at least an amount equal to a setup margin associated with the flop-repeater circuit and any timing uncertainties associated with data or clock signals.

6. The NOC interconnect of claim 1, wherein the source circuit comprises a first-in-first-out (FIFO) buffer, wherein the sink circuit comprises a second FIFO buffer, wherein data is written into the FIFO buffer associated with the source circuit at a first rate, and wherein the data is read from the FIFO buffer associated with the source circuit at a second rate, wherein the second rate is twice the first rate.

7. The NOC interconnect of claim 6, wherein the data is written into the second FIFO buffer associated with the sink circuit at the second rate, and wherein the data is read from the second FIFO buffer associated with the sink circuit at the first rate.

8. A method for transmitting data from a source circuit to a sink circuit using a network-on-chip (NOC) interconnect, wherein the NOC interconnect is clocked using a source synchronous clock signal, the method comprising:

a local programmable delay circuit, associated with a first NOC interconnect stage of the NOC interconnect, receiving the source synchronous clock signal and outputting a delayed source synchronous clock signal;

a local pulse generator, associated with the first NOC interconnect stage, receiving the delayed source synchronous clock signal, and generating a first pulse in response to a first phase of the delayed source synchronous clock signal and generating a second pulse in response to a second phase of the delayed source synchronous clock signal;

a flop-repeater circuit, associated with the first NOC interconnect stage, capturing and launching data received from the source circuit in response to each of the first pulse and the second pulse; and a local offset circuit, associated with the first NOC interconnect stage, receiving the delayed source synchronous clock signal and providing a de-skewed source synchronous clock signal.

9. The method of claim 8, further comprising a second NOC interconnect stage receiving the launched data from the flop-repeater circuit and the de-skewed source synchronous clock signal from the local offset circuit.

10. The method of claim 9, wherein the second NOC interconnect stage comprises: (1) a second local programmable delay circuit to receive the de-skewed source synchronous clock signal and output a delayed and de-skewed source synchronous clock signal, (2) a second local pulse generator configured to receive the delayed and de-skewed source synchronous clock signal and generate a third pulse in response to the first phase of the delayed and de-skewed source synchronous clock signal and generate a fourth pulse in response to the second phase of the delayed and de-skewed source synchronous clock signal, (3) a second flop-repeater circuit to both capture and launch the launched data received from the first NOC interconnect stage in response to each of the third pulse and the fourth pulse, and (4) a second local offset circuit, wherein the second local offset circuit is configured to receive the delayed and de-skewed source synchronous clock signal and further de-skew the delayed and de-skewed source synchronous clock signal.

11. The method of claim 8, further comprising transmitting data across the NOC interconnect during each of two phases of a clock signal for a corresponding NOC interconnect stage, allowing transmission of the data across the NOC interconnect at twice the rate possible with transmission of data during only one of the two phases of the clock signal.

12. The method of claim 8, wherein the delayed source synchronous clock signal is delayed by at least an amount equal to a setup margin associated with the flop-repeater circuit and any timing uncertainties associated with data or clock signals.

13. The method of claim 8, wherein the source circuit comprises a first-in-first-out (FIFO) buffer, wherein the sink circuit comprises a second FIFO buffer, wherein data is written into the FIFO buffer associated with the source circuit at a first rate, and wherein the data is read from the FIFO buffer associated with the source circuit at a second rate, wherein the second rate is twice the first rate.

14. The method of claim 13, wherein the data is written into the second FIFO buffer associated with the sink circuit at the second rate, and wherein the data is read from the second FIFO buffer associated with the sink circuit at the first rate.

15. A system comprising:

a first functional block coupled to a source circuit;

a second functional block coupled to a sink circuit; and a network-on-chip (NOC) interconnect for transmitting data from the source circuit to the sink circuit, wherein the NOC interconnect is clocked using a source synchronous clock signal, the NOC interconnect comprising:

a first NOC interconnect stage, to receive data from the source circuit, comprising: (1) a local programmable delay circuit to receive the source synchronous clock signal and output a delayed source synchronous clock signal, (2) a local pulse generator to receive the delayed source synchronous clock signal and generate a first pulse in response to a first phase of the delayed source synchronous clock signal and generate a second pulse in response to a second phase of the delayed source synchronous clock signal, (3) a flop-repeater circuit to both capture and launch data received from the source circuit in response to each of the first pulse and the second pulse, and (4) a local offset circuit, wherein the local offset circuit is configured to receive the delayed source synchronous clock signal and provide a de-skewed source synchronous clock signal, and a second NOC interconnect stage to receive the launched data from the flop-repeater circuit and the de-skewed source synchronous clock signal from the local offset circuit, wherein data is transmitted across the NOC interconnect during each of two phases of a clock signal for a corresponding NOC interconnect stage, allowing transmission of the data across the NOC interconnect at twice the rate possible with transmission of data during only one of the two phases of the clock signal.

16. The system of claim 15, wherein the second NOC interconnect stage comprises: (1) a second local programmable delay circuit to receive the de-skewed source synchronous clock signal and output a delayed and de-skewed source synchronous clock signal, (2) a second local pulse generator configured to receive the delayed and de-skewed source synchronous clock signal and generate a third pulse in response to the first phase of the delayed and de-skewed source synchronous clock signal and generate a fourth pulse in response to the second phase of the delayed and de-skewed source synchronous clock signal, (3) a second flop-repeater circuit to both capture and launch the launched data received from the first NOC interconnect stage in response to each of the third pulse and the fourth pulse, and (4) a second local offset circuit, wherein the second local offset circuit is configured to receive the delayed and de-skewed source synchronous clock signal and further de-skew the delayed and de-skewed source synchronous clock signal.

17. The system of claim 15, further comprising a third NOC interconnect stage, wherein the third NOC interconnect stage is configured to receive the launched data from the second flop-repeater circuit and the further de-skewed delayed and de-skewed source synchronous clock signal from the second local offset circuit.

18. The system of claim 15, wherein the delayed source synchronous clock signal is delayed by at least an amount equal to a setup margin associated with the flop-repeater circuit and any timing uncertainties associated with data or clock signals.

19. The system of claim 15, wherein the source circuit comprises a first-in-first-out (FIFO) buffer, wherein the sink circuit comprises a second FIFO buffer, wherein data is written into the FIFO buffer associated with the source circuit at a first rate, and wherein the data is read from the FIFO buffer associated with the source circuit at a second rate, wherein the second rate is twice the first rate.

20. The system of claim 19, wherein the data is written into the second FIFO buffer associated with the sink circuit at the second rate, and wherein the data is read from the second FIFO buffer associated with the sink circuit at the first rate.

* * * * *